US009336995B2

(12) United States Patent
Coumou et al.

(10) Patent No.: US 9,336,995 B2
(45) Date of Patent: May 10, 2016

(54) MULTIPLE RADIO FREQUENCY POWER SUPPLY CONTROL OF FREQUENCY AND PHASE

(71) Applicant: MKS Instruments, Inc., Andover, MA (US)

(72) Inventors: David J. Coumou, Webster, NY (US); Michael L. Kirk, Bloomfield, NY (US); Daniel M. Gill, Macedon, NY (US)

(73) Assignee: MKS Instruments, Inc., Andover, MA (US)

(*) Notice: Subject to any disclaimer, the term of this patent is extended or adjusted under 35 U.S.C. 154(b) by 108 days.

(21) Appl. No.: 14/249,972

(22) Filed: Apr. 10, 2014

(65) Prior Publication Data

US 2014/0320013 A1 Oct. 30, 2014

Related U.S. Application Data

(60) Provisional application No. 61/816,324, filed on Apr. 26, 2013.

(51) Int. Cl.
*H05B 31/26* (2006.01)
*H01J 37/32* (2006.01)

(52) U.S. Cl.
CPC ..... *H01J 37/32082* (2013.01); *H01J 37/32155* (2013.01); *H01J 37/32165* (2013.01); *H01J 37/32935* (2013.01)

(58) Field of Classification Search
USPC .............. 315/111.21, 111.41, 111.51, 111.71; 118/723 R; 219/121.43, 121.34, 121.54
See application file for complete search history.

(56) References Cited

U.S. PATENT DOCUMENTS

| 6,309,978 | B1 | 10/2001 | Donohoe et al. |
| 7,602,127 | B2* | 10/2009 | Coumou ........... H01J 37/32082 |
| | | | 118/723 I |
| 2006/0232471 | A1 | 10/2006 | Coumou |
| 2009/0315463 | A1 | 12/2009 | Coumou |
| 2011/0192349 | A1 | 8/2011 | Hammond, IV et al. |
| 2011/0248634 | A1 | 10/2011 | Heil et al. |
| 2012/0013253 | A1 | 1/2012 | Coumou |

FOREIGN PATENT DOCUMENTS

| CN | 101978461 A | 2/2011 |
| TW | 200952560 A | 12/2009 |

(Continued)

OTHER PUBLICATIONS

Coburn, J.W. and E. Kay, "Positive-Ion Bombardment of Substrated in RF Diode Glow Discharge Sputtering;" J. Appl. Phys. 43, 4965-71, 1972, Print.

(Continued)

*Primary Examiner* — Minh D A
(74) *Attorney, Agent, or Firm* — Harness, Dickey & Pierce, P.L.C.

(57) ABSTRACT

A system has a first RF generator and a second RF generator. The first RF generator controls the frequency of the second RF generator. The first RF generator includes a power source, a sensor, and a sensor signal processing unit. The sensor signal processing unit is coupled to the power source and to the sensor. The sensor signal processing unit scales the frequency of the first RF generator to control the frequency of the second RF generator.

29 Claims, 4 Drawing Sheets

(56) References Cited

FOREIGN PATENT DOCUMENTS

TW 201103086 A 1/2011
TW 201206254 A 2/2012

OTHER PUBLICATIONS

Booth, J.P., G. Gunge, and N. Sadeghi, "The Transition from Symmetric to Asymmetric Discharge in Pulsed 13.56 MHz Capacitively Coupled Plasmas;" J. Appl. Phys. 43 (2), Jul. 15, 1997, Print.

Wang, S.-B. and A.E. Wendt, "Ion Embardment Energy and SiO2/Si Fluorocarbon Plasma Etch Selectivity," Journal of Vacuum Science & Technology A: Vacuum, Surfaces, and Films, vol. 19, No. 5, pp. 2425-2432, Sep. 2001, Print.

Boyle, P.C., A.R. Ellingboe, and M.M. Turner, "Independent Control of Ion Current and Ion Impact Energy onto Electrodes in Dual Frequency Plasma Devices," J. Phys. D: Appl. Phys., 37, p. 697-701, 2004, Print.

Agarwal, A., S. Banna, V. Todorow, S. Raug, and K. Collins, "Impact of Phase Shifted Coil Currents on Plasma Uniformity," IEEE Trans. Plasma Science, vol. 39, No. 11, Nov. 2011, Print.

Taiwanese Office Action for Application No. 10421742940 dated Dec. 28, 2015, and its English translation thereof.

Chinese Office Action and Search Report for Chinese App. No. 201410171657.4 dated Jan. 28, 2016, and its English translation thereof.

* cited by examiner

MULTIPLE RADIO FREQUENCY POWER SUPPLY CONTROL OF FREQUENCY AND PHASE

FIELD

The present disclosure relates to radio frequency (RF) generators and, more particularly, to frequency and phase control of multiple RF generators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by one or more radio frequency (RF) generators of a RF power system. The RF power signals generated by the RF generators must be precisely controlled to effectively execute plasma etching.

A RF power system may include a RF generator, a matching network, and a load, such as a plasma chamber. The RF power signals may be used to drive the load to fabricate various components such as integrated circuits, solar panels, compact disks (CDs), digital versatile (or video) discs (DVDs), and the like. The load may include any of a number of elements or devices driven by a RF signal, including, by way of a non-limiting example, a plasma chamber. The load may include broadband mismatched loads (i.e. cables with mismatched resistor terminations), narrowband mismatched loads (i.e. a 2-element matching network) and resonator loads.

The RF power signals are received at the matching network. The matching network matches an input impedance of the matching network to a characteristic impedance of a transmission line between the RF generator and the matching network. This impedance matching aids in minimizing an amount of power applied to the matching network in a forward direction toward the plasma chamber ("forward power") and reflected back from the matching network to the RF generator ("reverse power"). Impedance matching also assists in maximizing forward power output from the matching network to the plasma chamber.

In the RF power supply field, there are typically two approaches to applying the RF signal to the load. The first approach includes applying a continuous wave signal to the load. The continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load. The second approach to applying the RF signal to the load involves pulsing the RF signal, rather than applying a continuous wave signal to the load.

BRIEF DESCRIPTION OF DRAWINGS

The present disclosure will become more fully understood from the detailed description and the accompanying drawings, wherein.

In the drawings, reference numbers may be reused to identify similar and/or identical elements.

DESCRIPTION

Plasma etching is frequently used in semiconductor fabrication. In plasma etching, ions are accelerated by an electric field to etch exposed surfaces on a substrate. To effectively execute a plasma etching process, the power delivered from a radio frequency (RF) generator to the plasma chamber must be precisely controlled. A RF generator system typically includes a RF power source, a RF sensor, and a sensor signal processing unit. The RF power source generates RF power signals detected by the sensor. The sensor outputs analog sensor signals representative of the RF power signals. The analog sensor signals include a frequency of interest and a plurality of interfering frequency components. The sensor signal processing unit band limits the analog sensor signal to remove interfering frequency components from the analog sensor signal, thereby leaving an analog or digital representation of the frequency of interest.

Frequency and the phase of RF generators can be controlled. U.S. Pat. No. 7,602,127 discloses frequency and phase control of RF generators. The entire disclosure of U.S. Pat. No. 7,602,127 is incorporated herein by reference.

The below describe implementations provide a method to control the frequency and relative phase between two RF power supplies (RF generators) using a common (shared) clock source. By dividing a common clock source, greater long term frequency stability can be gained from the produced set of signals. By multiplying a common clock source, greater long term frequency stability can be gained from the produced set of signals. The frequency spectrums of the RF generators are controlled via one or more control signals transmitted between the RF power supplies.

Two stand-alone RF power supplies that are frequency and phase controlled in a master/slave mode are disclosed. A clock signal is shared to produce a set of frequency outputs and corresponding relative phase. A digital phase lock loop (PLL) is included. This technique provides long term frequency stability in contrast to a digital PLL that is continuously regulating. The disclosed digital PLL limits control to configurable successive iterations and then holds a frequency locked. The resulting data (See FIG. 7 and corresponding description) provides objective evidence that the digital PLL performs as described. A process requiring several seconds can require frequency stability for the duration.

Figure 1:
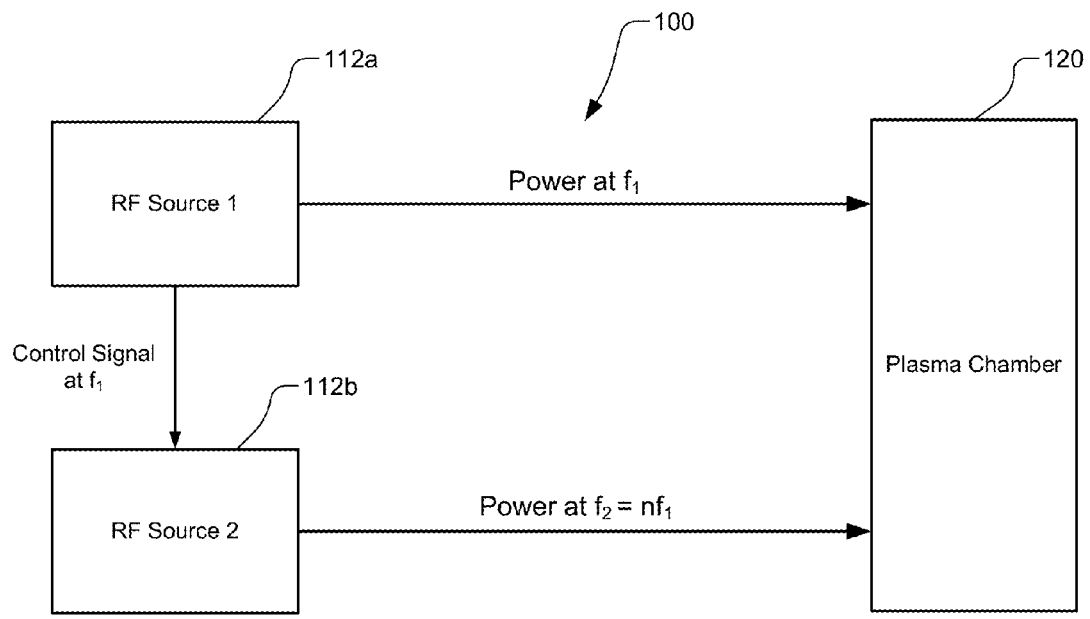
FIG. 1 is a functional block diagram of multiple RF sources (or generators) sharing frequency or phase control and connected to a plasma source (or load)
Figure 2:
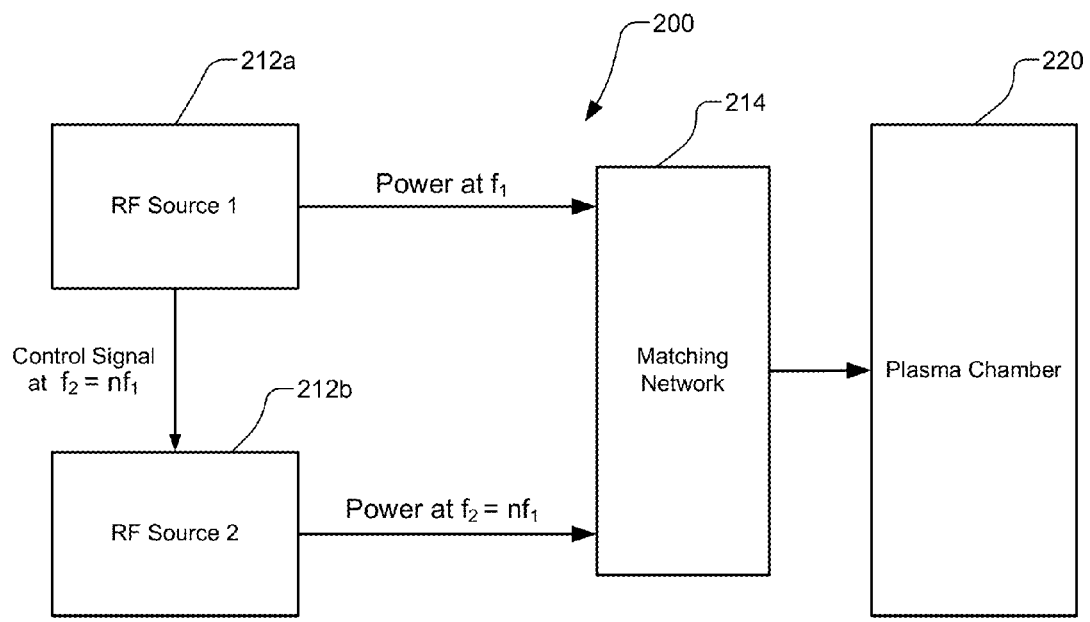
FIG. 2 is a functional block diagram of multiple RF sources sharing frequency or phase control and connected to a dual power matching network.

Two methods are disclosed to couple an RF control signal between two RF power supplies for the purpose of controlling frequency and phase of the RF power supplies. These methods correspond respectively to FIGS. 1 and 2. The method associated with the RF power system 100 FIG. 1 couples a control signal with frequency information from a RF Source 1 112a to a RF Source 2 112b. RF Source 2 112b can phase and frequency lock to the control signal. In the RF power system 200 of FIG. 2, RF Source 1 212a produces a RF control signal for the frequency and phase of RF Source 2 212b where the frequency is scaled by a factor n.

Figure 3:
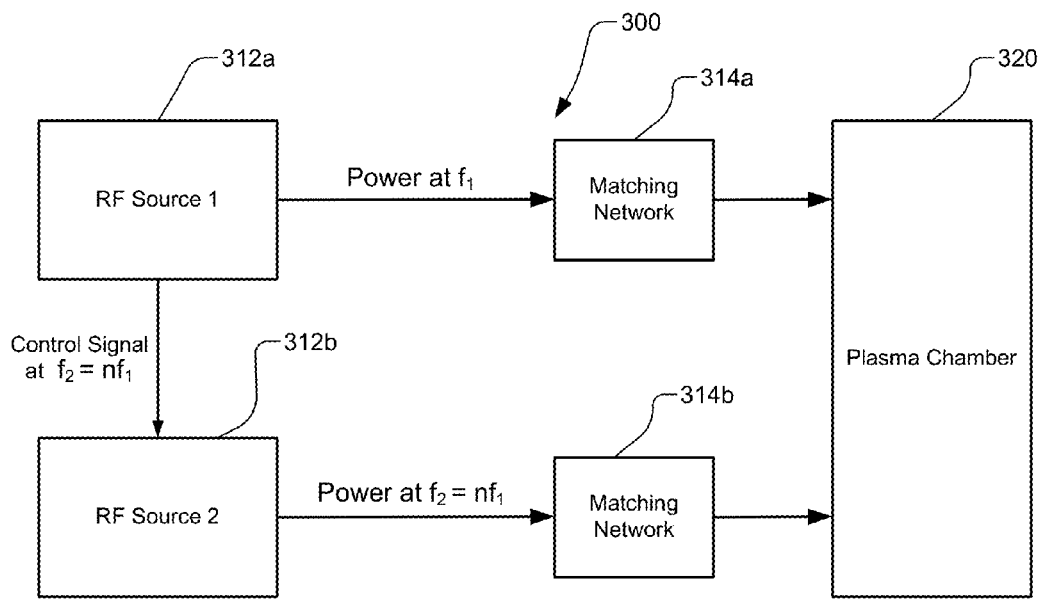
FIG. 3 is a functional block diagram illustrating frequency and relative phase control between multiple RF sources connected to a plasma chamber via respective matching networks.
Figure 4:
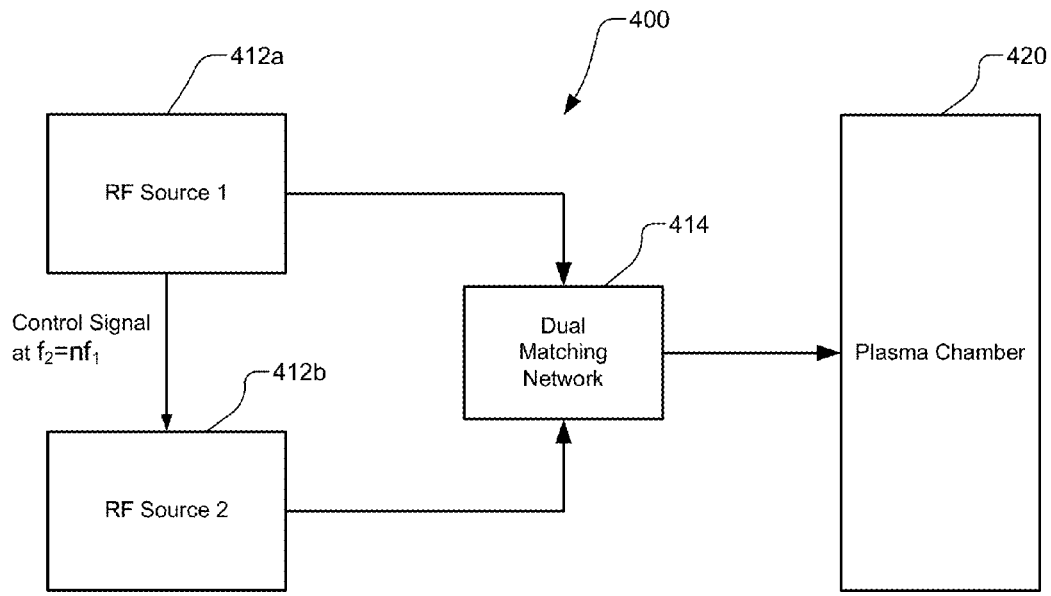
FIG. 4 is a functional block diagram illustrating frequency and relative phase control between multiple RF sources connected to a plasma chamber via a dual powered matching network.

Two block diagrams show in FIGS. 3 and 4 respective RF power systems 300 and 400 to control the frequency and phase between two RF power supplies 312a, 412a and 312b, 412b, respectively. The control signal is an RF signal that is coupled between the power supplies to excite RF power of the slave (RF Source 2 312b, 412b) with a frequency and phase associated with the master power (RF Source 1 312a, 412a). The implementations of FIGS. 3 and 4 differ by the function of the impedance matching network. In FIG. 3, the output of each RF power supply is connected to a matching network 314a, 314b that is connected directly to a plasma source 320. As an alternative, RF output power of the two RF power supplies (412a, 412b, for example) may be combined with a dual matching network 414 prior to the RF output power being provided to the plasma source 420, as shown in FIG. 4. The following disclosure describes deriving frequencies for the RF power supplies using a common clock source.

Figure 5:
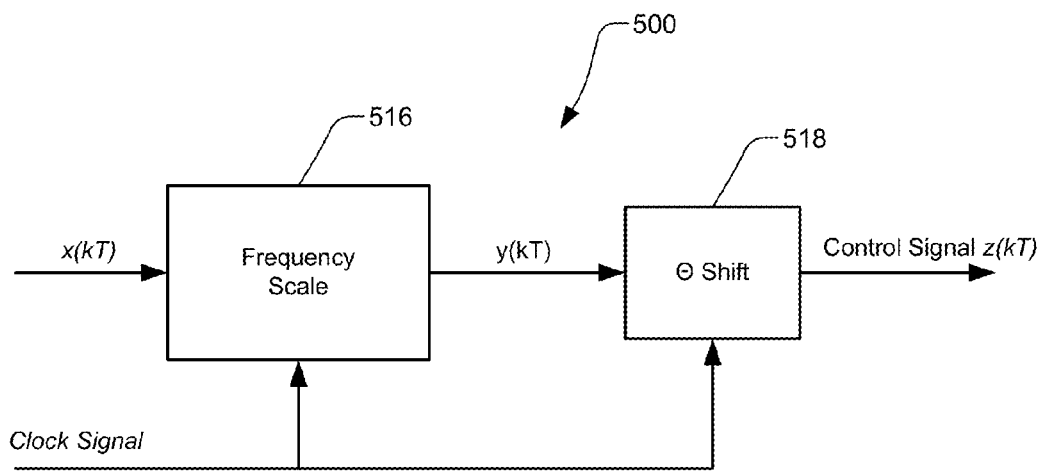
FIG. 5 is a functional block diagram illustrating frequency and relative phase control using a common (shared) clock signal from a clock source.

In FIG. 5, in a module 500 frequency and phase of the control signal z(kT) is based on a signal, x(kT), representative of the frequency and phase of RF Source 1 (master source). Frequency scaling and phase shift is applied to the frequency and phase of RF Source 1 by a common clock signal, with period T, allowing the control signal z(kT) to have a stable frequency that is referenced to the frequency and phase of RF Source 1. The output of the frequency scale process 516 produces y(kT)=x(nkT). For n>1, the frequency is increased by a factor of n. If 0<n>1, the frequency is decreased. To shift the relative phase of the required control signal, in a phase shift module 518 a delay of nd is applied to yield the control signal z(kT)=x(nkT+nd), where nd is a delay corresponding to a phase shift of θ for the periodicity of the signal z. There is no limitation to the digital signal types used in this implementation. The signals may be sinusoidal or binary. A circuit for binary signals may include a set of digital dividers and a counter for the phase shift (delay).

Figure 6:
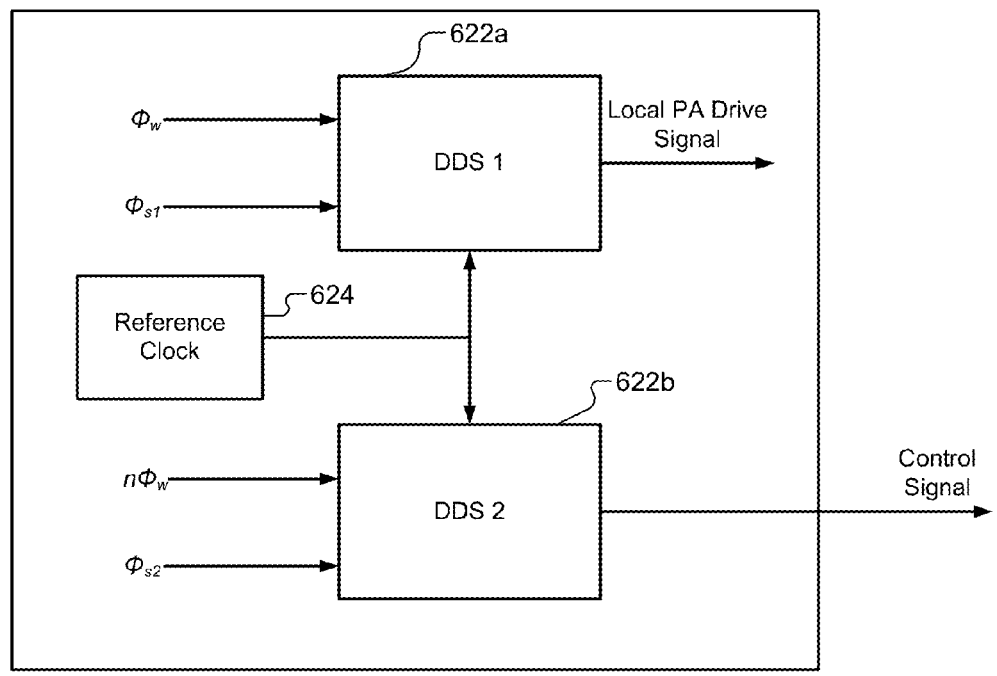
FIG. 6 is a functional block diagram of illustrating frequency and relative phase control based on a common reference clock signal from a reference clock source using direct digital synthesis (DDS) modules.

In the next example shown in FIG. 6, frequency synthesis module 600 uses a set of direct digital synthesis (DDS) modules 622a, 622b to produce two output signals with a relative phase shift when the signal pairs differ by an integer multiple. The phase word $\phi_w$ controls the frequency generated by the DDS module and the phase shift is adjusted by $\phi_s$. A common (or reference) clock 624 is used to reference the generation of a DDS output. To generate the frequency based on the DDS output of the local PA frequency, the second DDS module 622b is configured with phase word $n\phi_w$. The output of the second DDS 622b module provides the control signal with the configured frequency and phase for the excitation of RF Source 2. The phase shift between the two DDS modules is distinguished with an index to indicate the ability to control the relative phase between the two signals produced by the DDS modules when the frequencies of the DDS modules are the same or an integer multiple of each other.

This implementation utilizes a common clock source and can improve the long term frequency stability of the control signal or any derivative of the control signal. Frequency stability must be maintained for at least the reciprocal of the length of the thin-film manufacturing process. For instance, if the process is 10 seconds (s), the frequency stability is better than 10 mHz.

Analytical results support a new concept of multi-frequency harmonic drive with relative phase control. Early empirical results are congruent with initial modeling efforts showing controllable ion energy distribution skew control by varying the phase of a second harmonic drive. By skewing the distribution to lower energies, improved control of ion enhanced deposition in high aspect ratio (HAR) silicon etch can be achieved. Conversely, by skewing the distribution to higher energies, the performance of HAR processes in dielectrics can be ameliorated. The key enabling technology is the ability to phase lock two frequencies that are integer multiples.

Figure 7:
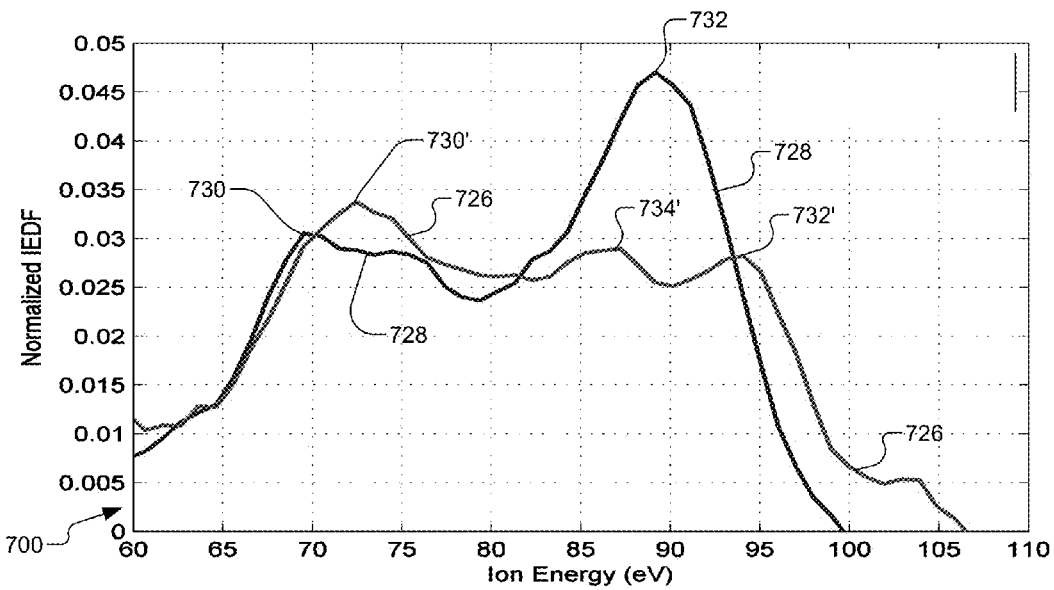
FIG. 7 is a plot illustrating control of plasma sheath symmetry with relative phase control of two harmonic sources.

A capacitively coupled plasma source can be characterized with a symmetric or asymmetric sheath. FIG. 7 shows a plot 700 illustrating control of plasma sheath symmetry with relative phase control of two harmonic sources. A symmetric plasma source 726 has identical sheaths and asymmetric plasma source 728 has differing sheaths on both sides of the plasma. Driving the plasma source with two RF sources derived as harmonics (13.56 and 27.12 MHz) permits the control between symmetric 726 or asymmetric 728 with relative phase, θ, adjustment. With asymmetric plasma (θ=±π), there should be two distinct peaks in the ion energy distribution function (IEDF). With symmetry (θ≠±π), there should be three distinct peaks in the IEDF. By adjusting the phase, the sheath and the corresponding IEDF are altered.

The plot in FIG. 7 shows via phase control the ability to control the sheath's symmetry. Asymmetry has two peaks: one peak 730 at the lower end of the swept energy range (≈70 eV) and a second peak 732 at the higher end (≈90 eV) that includes a third peak that is being adjusted by the relative phase between the two RF power supplies. This is the reason the higher peak is nearly double of the lower peak. When the phase is adjusted, the plasma source is changed to a symmetric sheath. This is seen with a nearly uniform IEDF distribution that contains all three peaks 730', 732', 734'. The symmetric case may have three distinct peaks and the asymmetric case may have two distinct peaks. IEDF measurements may be performed with the Semion sensor from Impedans.

For the symmetric and asymmetric curves shown in FIG. 7, the IEDF measurement was taken with an energy sweep of 2 eV resolution. This can be improved for a higher resolution plot along the x-axis. The outer peak locations were defined by the current being sourced to the plasma. Width of energy distribution and current ratio of the two RF sources were not optimized.

Figure 8:
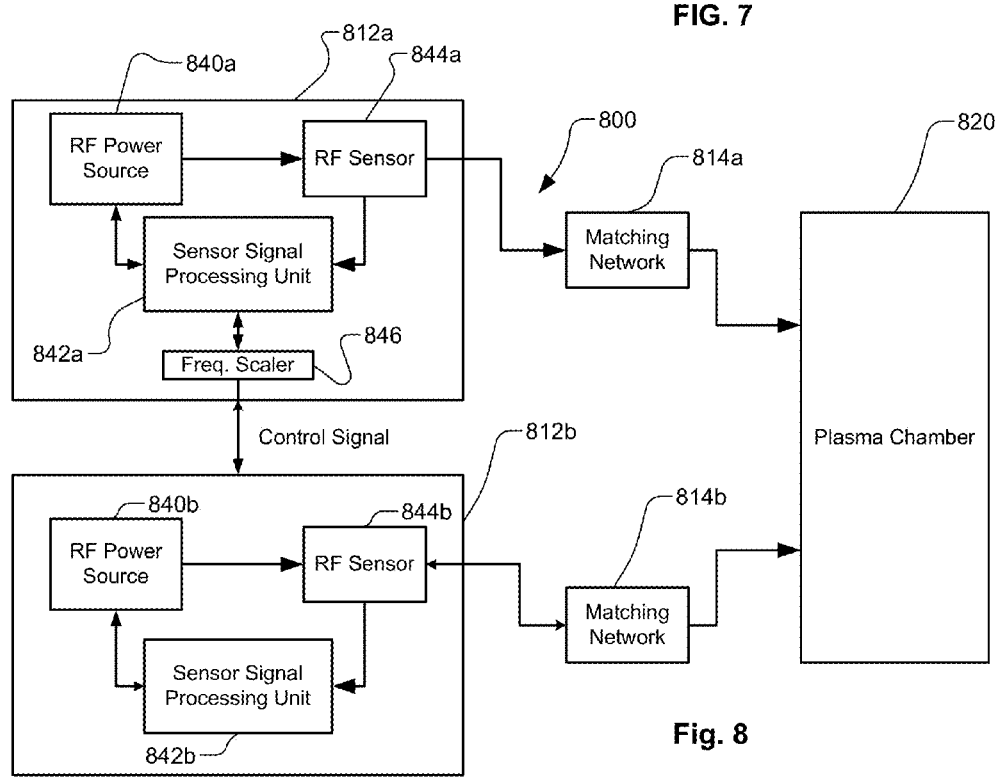
FIG. 8. Is a block diagram of a multiple RF sources arranged according to various embodiments.

FIG. 8 depicts a plasma system 800 including a pair of radio frequency (RF) signal generators for driving a mutually exclusive load represented by plasma chamber 820. Plasma system 800 includes first and second RF generators 812a, 812b, matching networks 814a, 814b, and plasma chamber 820. RF generators 812a, 812b can implement a master-and-slave configuration using a control signal. RF generator 812a is designated the master, and RF generator 812b is designated the slave. The frequency and phase of RF generator 812b may slaved to the frequency of RF generator 812a using a control signal sent from RF generator 812a to RF generator 812b.

When the control signal is absent, RF generators 812a and 812b can operate autonomously.

RF generators 812a, 812b include respective RF power sources 840a, 840b, RF sensors 844a, 844b, and sensor signal processing units 842a, 842b. RF power sources 840a, 840b generate RF power output to respective RF sensors 844a, 844b. RF sensors 844a, 844b detect the RF power output and generate respective RF power signals that vary in accordance with the RF power. RF sensors 844a, 844b include a respective voltage probe and a current probe. These probes output a RF voltage signal and a RF current signal. Alternatively, RF sensors 844a, 844b may be directional sensors. A directional sensor has outputs that correspond to reflected power or voltage (REV) and forward power or voltage (FWD).

In some embodiments sensor signal processing units 842a, 842b can, for example, receive and bandlimit the respective signals from RF sensors 844a, 844b. This removes interfering frequency components and leaves a component of interest at a desired frequency. Sensor signal processing units 842a, 842b also control the phase and frequency relationship of the RF power for respective RF generators 812a, 812b. The RF power signals are output to respective matching networks 814a, 814b. Matching networks 814a, 814b match the impedance of plasma chamber 820 to the impedance expected by first and second RF generators 812a, 812b. This minimizes reflected power and maximizes power transfer to plasma chamber 820. In some embodiments, more than two RF generators 812a, 812b can be arranged in the mutually exclusive load configuration of FIG. 8.

RF generator 812a also includes a frequency scaler 846. Frequency scaler 846 receives a frequency signal from sensor signal processing unit 842a and scales the frequency received from sensor signal processing unit 842a and outputs the scaled frequency as a control signal to second RF generator 812b. In the various embodiments, frequency scaler 846a can include the frequency scaler and phase shifter of FIG. 5. In various other embodiments, frequency scaler 846 can also include frequency synthesis module 600 or portions thereof.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed herein could be termed a second element, component, loop, circuit or module without departing from the teachings of the example implementations disclosed herein.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A radio frequency (RF) generator comprising:
 a RF power source;
 a sensor coupled to the RF power source; and
 a sensor signal processing unit coupled to the RF power source and to the sensor, the sensor signal processing unit adapted to receive an input from an external RF generator source and to generate a control signal to control phase and frequency of the RF generator, wherein the input from the external RF generator source includes a scaled version of a frequency at which the external RF generator source operates.

2. The RF generator of claim 1, wherein the input further comprises a phase shift.

3. The RF generator of claim 1, wherein the RF generator operates in a continuous wave or a pulsed mode of operation.

4. The RF generator of claim 1, wherein the sensor signal processing unit comprises a field programmable gate array (FPGA) unit and a digital signal processing unit.

5. The RF generator of claim 4, wherein the signal processing unit is operable to generate the control signal.

6. The RF generator of claim 1, wherein the RF generator varies an amplitude of an RF signal output by the RF generator.

7. The RF generator of claim 1, wherein the phase is varied between at least two phases.

8. The RF generator of claim 1, wherein the frequency is scaled to a value of one.

9. The RF generator of claim 1, wherein the phase is swept across a predefined range.

10. A radio frequency (RF) system comprising:
a first RF generator including:
  a power source;
  a sensor coupled to the power source; and
  a sensor signal processing unit coupled to the power source and to the sensor, the sensor signal processing unit adapted to receive an input from an external source and to generate a first control signal controlling at least one of a first phase and a first frequency of a RF power signal from the first RF generator; and
a second RF generator operable to receive a second control signal from the first RF generator, the second control signal controls at least one of a second phase and a second frequency of the second RF generator,
wherein the sensor signal processing unit scales the first frequency to generate frequency information, and the second control signal comprises the frequency information.

11. The RF system of claim 10, wherein the second control signal also includes phase shift information.

12. The RF system of claim 10, wherein the RF system operates in a continuous wave or a pulsed mode of operation.

13. The RF system of claim 12, wherein the RF system varies an amplitude of an RF signal output by the RF generator.

14. The RF system of claim 12, wherein the phase is varied between at least two phases.

15. The RF system of claim 14, wherein the frequency is scaled to a value of one.

16. The RF system of claim 12, wherein the phase is swept across a predefined range.

17. A RF system comprising:
a first RF generator; and
a second RF generator coupled to the first RF generator, the first and the second RF generators each including:
  a power source;
  a sensor coupled to the power source; and
  a sensor signal processing unit coupled to the power source and to the sensor, wherein the sensor signal processing unit for the first RF generator controls a phase and a frequency of the first RF generator and the sensor signal processing unit for the second RF generator control a phase and a frequency of the second RF generator,
wherein the first RF generator outputs a control signal to the second RF generator and wherein the control signal includes a frequency component and the frequency component is a frequency scaled relative to the frequency of the first RF generator.

18. The RF system of claim 17, wherein the control signal also includes phase shift information.

19. The RF system of claim 17, wherein the RF system operates in a continuous wave or a pulsed mode of operation.

20. The RF system of claim 19, wherein the phase is varied between at least two phases.

21. The RF system of claim 20, wherein the frequency is scaled to a value of one.

22. The RF system of claim 19, where in the phase is swept across a predefined range.

23. The RF system of claim 17 wherein the RF system varies an amplitude of an RF signal output by the RF generator.

24. A method comprising:
coupling a sensor to a power source;
coupling a sensor signal processing unit to the power source and to the sensor;
controlling a first RF generator to output a first RF frequency signal;
scaling the first RF frequency signal; and
generating a control signal to control phase and frequency of a second RF generator in accordance with a scaled first RF frequency signal.

25. The method of claim 24 further comprising generating a phase shift between the first RF generator and the second RF generator and generating the control signal in accordance with the phase shift.

26. The method of claim 24 further comprising operating the first RF generator and the second RF generator in a continuous wave or pulsed mode of operation.

27. The method of claim 24 where in the phase is varied between at least two phases.

28. The method of claim 27, where in the first RF frequency signal is scaled to a value of one.

29. The method of claim 24 wherein the phase is swept across a predetermined range.

* * * * *